(12) United States Patent
Cheng et al.

(10) Patent No.: US 11,348,828 B2
(45) Date of Patent: May 31, 2022

(54) INTERCONNECT STRUCTURE AND METHOD OF FORMING THE SAME

(71) Applicant: TAIWAN SEMICONDUCTOR MANUFACTURING CO., LTD., Hsinchu (TW)

(72) Inventors: Jye-Yen Cheng, Taichung (TW); Chen-Yu Shyu, Taipei (TW); Ming-Shuoh Liang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 20 days.

(21) Appl. No.: 15/891,505

(22) Filed: Feb. 8, 2018

(65) Prior Publication Data
US 2019/0157139 A1    May 23, 2019

Related U.S. Application Data

(60) Provisional application No. 62/590,293, filed on Nov. 23, 2017.

(51) Int. Cl.
*H01L 21/768* (2006.01)
*H01L 23/522* (2006.01)
*H01L 23/528* (2006.01)
*H01L 23/532* (2006.01)
*H01L 21/311* (2006.01)

(52) U.S. Cl.
CPC .. *H01L 21/76813* (2013.01); *H01L 21/31116* (2013.01); *H01L 21/76816* (2013.01); *H01L 21/76834* (2013.01); *H01L 23/5226* (2013.01); *H01L 23/53295* (2013.01); *H01L 21/76843* (2013.01); *H01L 23/5222* (2013.01); *H01L 23/5283* (2013.01)

(58) Field of Classification Search
CPC ............... H01L 21/76813; H01L 23/5226
See application file for complete search history.

(56) References Cited

U.S. PATENT DOCUMENTS

| | | | | |
|---|---|---|---|---|
| 5,801,094 A | * | 9/1998 | Yew | H01L 21/7681 257/E21.579 |
| 6,025,226 A | * | 2/2000 | Gambino | H01L 21/76807 257/E21.009 |
| 6,093,632 A | * | 7/2000 | Lin | H01L 21/7681 257/E21.579 |
| 6,133,144 A | * | 10/2000 | Tsai | H01L 21/7681 257/758 |

(Continued)

OTHER PUBLICATIONS

Plasma processing of low-k dielectrics: https://www.researchgate.net/publication/323581934_Plasma_processing_of_low-k_dielectrics?_sg=iWnk3PYdtF_GjL2BIIWIxO1WXSLmFP2dGYWvm77c6Z-KWplAmKMTfJh5PTJeonPJ3_VEF6OMYQ.*

*Primary Examiner* — Kenneth Parker
*Assistant Examiner* — Long H Le
(74) *Attorney, Agent, or Firm* — Birch, Stewart, Kolasch & Birch, LLP

(57) ABSTRACT

An interconnect structure includes a damascene structure, an inter-metal dielectric (IMD), a dielectric block and a metal via. The inter-metal dielectric layer is over the damascene structure. The dielectric block is embedded in the IMD layer and has a different etch selectivity than the IMD layer. The metal via is in the IMD layer and through the dielectric block to electrically connect the damascene structure.

20 Claims, 14 Drawing Sheets

(56) References Cited

U.S. PATENT DOCUMENTS

| | | | | |
|---|---|---|---|---|
| 6,228,755 | B1* | 5/2001 | Kusumi | H01L 21/76804 257/E21.579 |
| 2006/0145296 | A1* | 7/2006 | Coolbaugh | H01L 28/20 257/536 |
| 2007/0205482 | A1* | 9/2007 | Yang | H01L 21/02063 257/499 |
| 2010/0314777 | A1* | 12/2010 | Oda | H01L 21/76804 257/774 |
| 2012/0223437 | A1* | 9/2012 | Heinrich | H01L 23/5222 257/774 |
| 2015/0179579 | A1* | 6/2015 | Jezewski | H01L 21/76846 257/753 |
| 2016/0343660 | A1* | 11/2016 | Kim | H01L 23/5226 |

* cited by examiner

INTERCONNECT STRUCTURE AND METHOD OF FORMING THE SAME

PRIORITY CLAIM AND CROSS-REFERENCE

This application claims priority to U.S. Provisional Application Ser. No. 62/590,293, filed Nov. 23, 2017, which is herein incorporated by reference.

BACKGROUND

Single or dual damascene processes are techniques for forming interconnections in semiconductor devices. As the feature sizes get smaller, the single or dual damascene processes provide a more exact dimensional control over small geometries. Therefore, the dual damascene process is suited for ultra large scale integrated (ULSI) circuit technology where more and more devices are being packed into the same or smaller areas in a semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
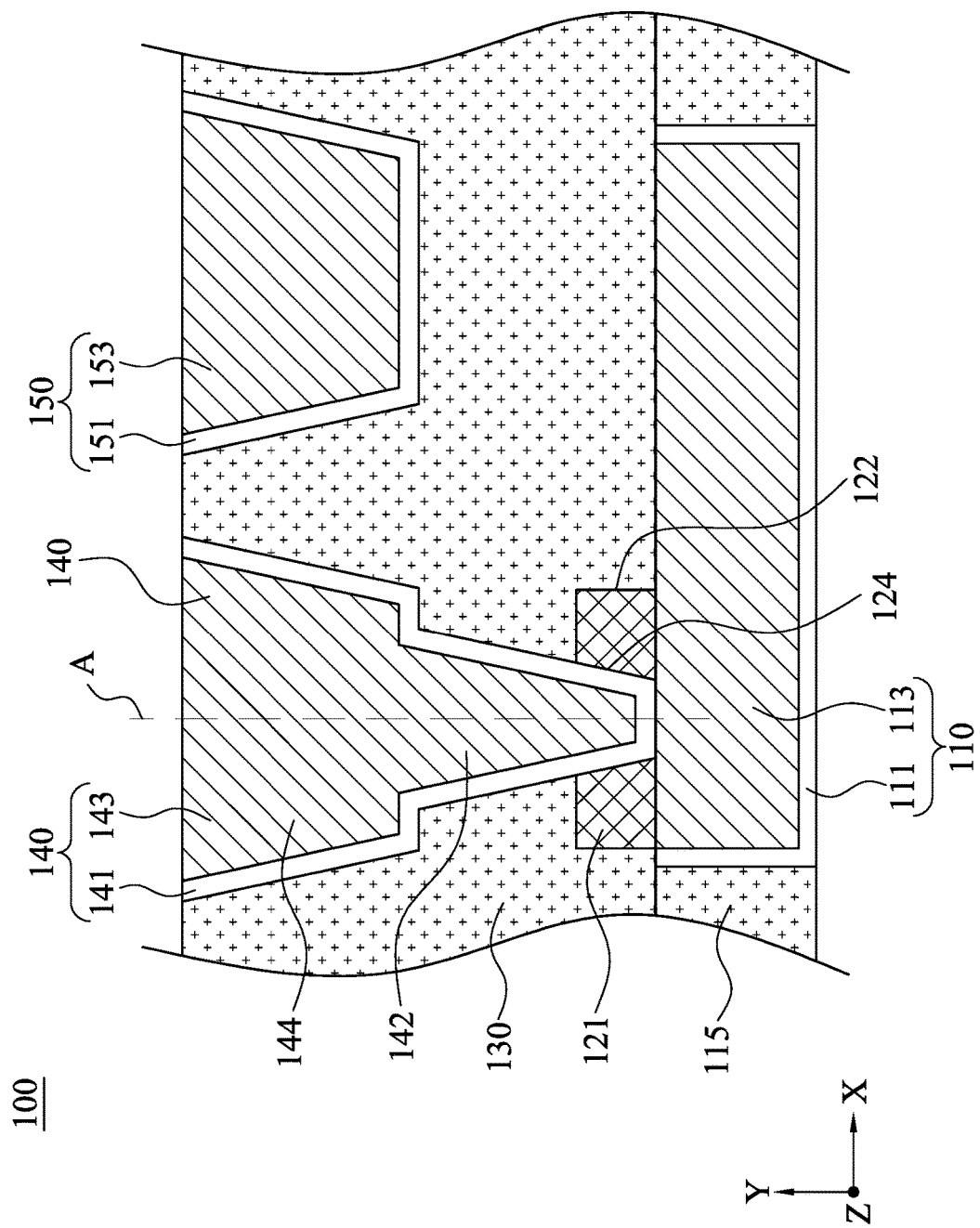
FIG. 1 is a cross-sectional view of an interconnect structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the current process of miniaturizing semiconductor devices, low-k or extremely low-k dielectric materials are desired as the inter-metal and/or inter-layer dielectric between conductive interconnects in order to reduce the resistive-capacitive (RC) delay in signal propagation due to capacitive effects. As such, the lower the dielectric layer constant of the dielectric, the lower the parasitic capacitance of adjacent conductive lines and the lower the RC delay of the integrated circuit (IC). However, etch stop layers alternatingly arranged with the inter-metal dielectric layers inevitably have higher dielectric constants than the low-k or extremely low-k inter-metal dielectric layers. Therefore, embodiments of the present disclosure implement one or more island-like ESL blocks separately arranged on an underlying IMD layer, instead of a blanket etch stop layer extending along the entire IMD layer. Such island-like ESL blocks will effectively reduce the ESL area between conductive interconnects, which in turn will reduce the RC delay.

Reference is made to FIG. 1. FIG. 1 is a cross-sectional view of an interconnect structure 100 in accordance with some embodiments of the present disclosure. In some embodiments, as shown in FIG. 1, an interconnect structure 100 includes a metallization layer 110 in a first inter-metal dielectric (IMD) layer 115, a dielectric block 121, a second IMD layer 130 and a conductive structure 140. The metallization layer 110 and the first IMD layer 115 can be in combination referred to as a damascene structure, such as a single-damascene structure or a dual-damascene structure. The dielectric block 121 is over the metallization layer 110. The dielectric block 121 has an outer sidewall 122. The second IMD layer 130 is over the metallization layer 110, the dielectric block 121 and the first IMD layer 115. The second IMD layer 130 further surrounds the dielectric block 121 and is in contact with the outer sidewall 122 of the dielectric block 121. The conductive structure 140 penetrates through the second IMD layer 130 and the dielectric block 121. Furthermore, the conductive structure 140 is electrically connected to the metallization layer 110. The dielectric block 121 does not cover an entirety of the damascene structure. For example, the dielectric block 121 does not cover an entirety of the metallization layer 110. In other words, the damascene structure has a metal portion (i.e., portion of the metallization layer 110) free from coverage by the dielectric block 121. Stated differently, the metallization layer 110 is partially covered by the dielectric block 121. In this way, the area of the dielectric block 121 is effectively reduced, which in turn will be advantageous for reducing unwanted capacitance in the interconnect structure 100. Moreover, the dielectric block 121 does not cover an entirety of the IMD layer 115. In other words, the damascene structure has a dielectric portion (i.e., a portion or an entirety of the IMD layer 115) free from coverage by the dielectric block 121.

Dielectric constant of the IMD layer(s), such as the first and second IMD layers 115 and 130, is as low as possible and thus results in reduced capacitive coupling between neighboring metallization layers. As a result, in some embodiments, the first and second IMD layers 115 and 130 are made of low-k dielectric materials, such as silicon oxide, low-k silicon oxide (e.g., porous silicon oxide), the like, or combinations thereof. In some embodiments, the IMD layers 115 and 130 have dielectric constants lower than 2.4. Another dielectric material in the interconnect structure 100 is the dielectric block 121 which acts as an etch stop layer (ESL) during etching a via opening in the second IMD layer 130, wherein the via opening is used to receive a conductive material to form the conductive structure 140. In comparison to the IMD layers, suitable materials for serving as the ESL are usually different dielectric materials with higher dielectric constants than the low-k dielectric materials of IMD layers. As a result, the dielectric block 121 has a higher dielectric constant than the IMD layers 115 and 130. If the dielectric block 121 is formed a blanket layer over substantial entireties of the metallization layer 110 and the first IMD layer 115, the capacitive coupling between neighboring metallization layers would be increased, leading to degraded RC delay. In contrast, the present disclosure implements the dielectric block 121 as an island-like structure that covers a partial region of the metallization layer 110, rather than substantial entireties of the metallization layer 110 and the first IMD layer 115. Therefore, the dielectric block 121 has a reduced area compared to a blanket ESL, which in turn will result in reduced capacitive coupling between neighboring metallization layers in the interconnect structure 100, which in turn will result in improved RC delay.

Figure 2:
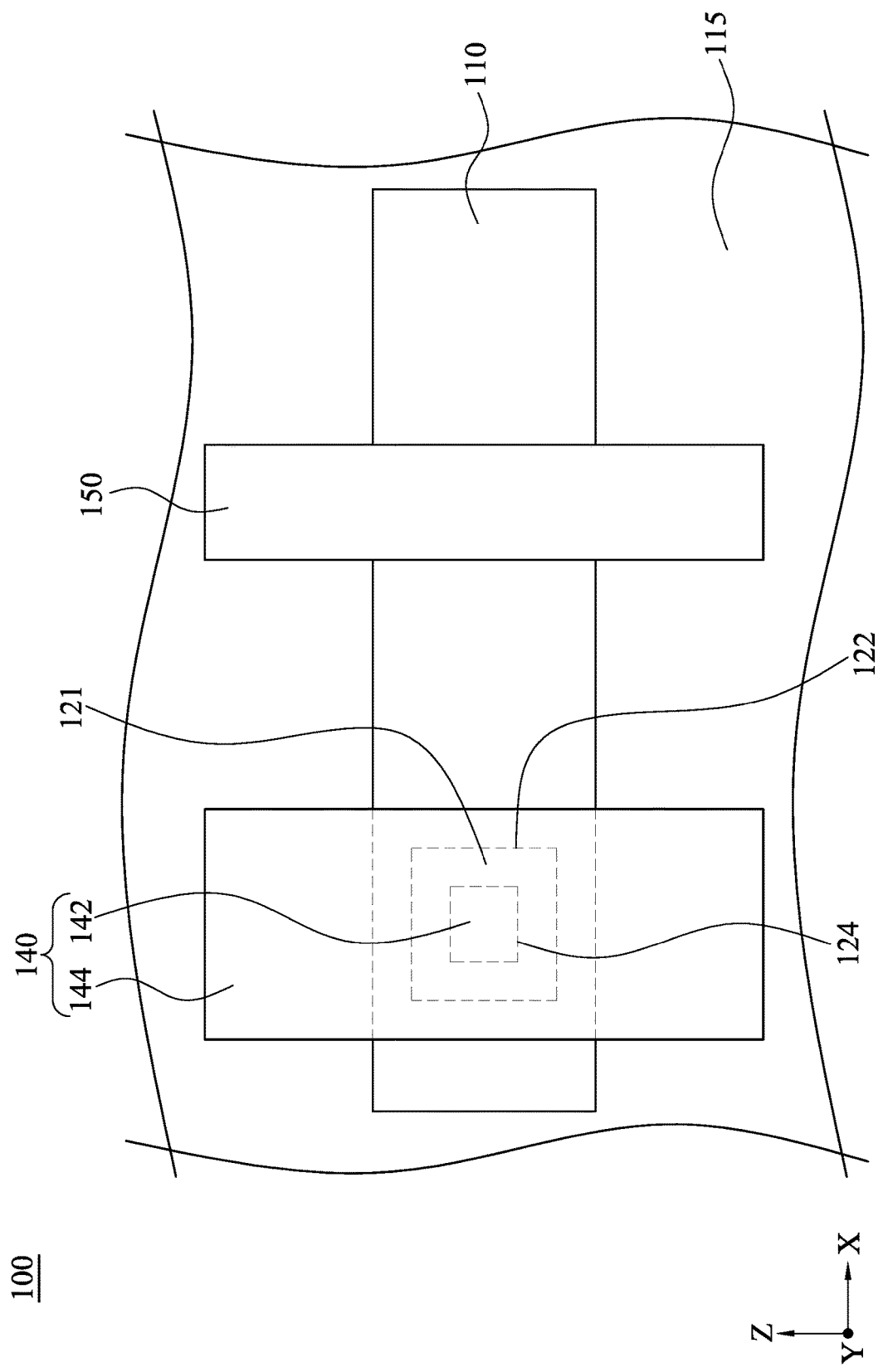
FIG. 2 is a layout view of the interconnect structure of FIG. 1.

In some embodiments, the conductive structure 140 includes a metal via 142 and a metal line 144 capping the metal via 142. The metal line 144 has a minimal width at its bottom greater than a maximal width of the metal via 142 at its top. As a result, the metal via 142 and the metal line 144 collectively form a stepped sidewall profile, as illustrated in FIG. 1. Moreover, the metal line 144 has a lengthwise direction substantially perpendicular to a lengthwise direction of the metal via 142, as illustrated in FIGS. 1 and 2, wherein FIG. 2 is a layout view of the interconnect structure 100 of FIG. 1. For example, the lengthwise direction of the metal line 144 is substantially the Z-direction, and the lengthwise direction of the metal via 142 is substantially the Y-direction perpendicular to the Z direction. As a result, one or more metal lines 144 implement horizontal interconnection, and one or more metal vias 142 implement vertical interconnections.

In some embodiments, as shown in FIG. 1, the metal via 142 penetrates through a central region of the dielectric block 121, according to some embodiments. In further embodiments, the metal via 142 is substantially symmetrical about a central axis A of the dielectric block 121. In some embodiments, the dielectric block 121 is penetrated by a single metal via 142, rather than by multiple metal vias 142. Stated in another way, a single dielectric block 121 is exclusive to a single metal via 142. In further embodiments, multiple dielectric blocks 121 are penetrated by the metal vias 142, respectively. That is to say, multiple dielectric blocks 121 correspond to the metal vias 142 in a one-to-one manner.

In some embodiments, the outer sidewall 122 and the inner sidewall 124 of the dielectric block 121 are formed at different fabrication stages, which will be explained further below. Due to different conditions and/or different processes between formations of the outer sidewall 122 and the inner sidewall 124, the outer sidewall 122 and the inner sidewall 124 may have different profiles. For example, in the illustration of FIG. 1, the outer sidewall 122 is substantially straight, and the inner sidewall 124 is sloped with respect to the outer sidewall 122. In some other embodiments, either the inner sidewall 124 or the outer sidewall 122 is sloped, and they may have different slopes because they are formed at different fabrication stages. Stated differently, the outer sidewall 122 is non-parallel with the inner sidewall 124. For example, an interface between the dielectric block 121 and the IMD layer 130 is non-parallel with an interface between the dielectric block 121 and the metal via 142.

In some embodiments, the metal via 142 tapers toward the metallization layer 110. Stated differently, a width of the metal via 142 decreases as a distance from the metallization layer 110 decreases. Due to the tapered profile of the metal via 142, the metal via 142 has a tapered sidewall in contact with the tapered inner sidewall 124 of the dielectric block 121. Similar to the metal via 142, the metal line 144 tapers toward the metal via 142. Stated differently, a width of the metal line 144 decreases as a distance from the metal via 142 decreases. Due to the tapered profile of the metal line 144, the metal line 144 has a tapered sidewall in contact with a tapered sidewall of the IMD 130.

In some embodiments, as illustrated in FIG. 2, the metal line 144 spans the dielectric block 121. In further embodiments, the metal line 144 extends across the dielectric block 121 along the widthwise direction of the metal line 144 (i.e., X-direction in FIG. 2). As a result, the dielectric block 121 is entirely covered by the metal line 144 in such embodiments. Such a configuration will lead to further reduced capacitance in the interconnect structure 100 due to the further scaled-down dielectric block 121.

In some embodiments, the conductive structure 140 includes a diffusion barrier layer 141 and a metal fill layer 143 surrounded by the diffusion barrier layer 141, as shown in FIG. 1. The diffusion barrier layer 141 has higher diffusion resistance to the metal fill layer 143 than that of the IMD layer 130. Thus, the diffusion barrier layer 141 can reduce metal diffusion from the metal fill layer 143 into the IMD layer 130. By way of example, the metal fill layer 143 is a copper layer, and the diffusion barrier layer 141 has higher copper diffusion resistance than that of the IMD layer 130, and hence the diffusion barrier layer 141 can prevent copper diffusion into the IMD layer 130. In some embodiments, the diffusion barrier layer 141 may comprise tantalum nitride, although other materials, such as tantalum, titanium, titanium nitride, the like, or combinations thereof may alternatively be used.

As illustrated in FIG. 1, either the metal via 142 or the metal line 144 includes the diffusion barrier layer 141 and the metal fill layer 143 surrounded by the diffusion barrier layer 141. Therefore, an upper portion of the IMD layer 130 surrounding the metal line 144 and a lower portion of the IMD layer 130 surrounding the metal via 142 can be protected from unwanted metal diffusion. Moreover, the interconnect structure 100 further includes another metal line 150 in the IMD layer 130 according to some embodiments. The metal line 150 is separated from the conductive structure 140 by the IMD layer 130. As illustrated in FIG. 2, a lengthwise direction of the metal line 150 is substantially parallel with the lengthwise direction of the metal line 144 (i.e., Z-direction). The metal line 150 includes a diffusion barrier layer 151 and a metal fill layer 153 surrounded by the diffusion barrier layer 151, which are respectively similar to or the same as the diffusion barrier layer 141 and the metal fill layer 143, in material and/or composition. The diffusion barrier layer 151 can reduce metal diffusion from the metal fill layer 153 into the IMD layer 130.

In some embodiments, as illustrated in FIG. 1, the metallization layer 110 includes a diffusion barrier layer 111 and a metal fill layer 113 surrounded by the diffusion barrier layer 111, which are respectively similar to or the same as the diffusion barrier layer 141 and the metal fill layer 143, in material and/or composition. The diffusion barrier layer 111 thus reduces metal diffusion from the metal fill layer 113 into the IMD layer 115.

In some embodiments, as shown in FIG. 2, the metal via 142 resembles a rectangle or square in a top view. In some other embodiments, the metal via 142 resembles other shapes, such as a circle or an oval in the top view. Furthermore, in some embodiments, as shown in FIG. 2, the dielectric block 121 resemble a rectangle or square in the top view. In other words, the metal via 142 and the dielectric block 121 resemble substantially the same shape (e.g. rectangle), and the dielectric block 121 has greater dimension than the metal via 142.

Figure 3:
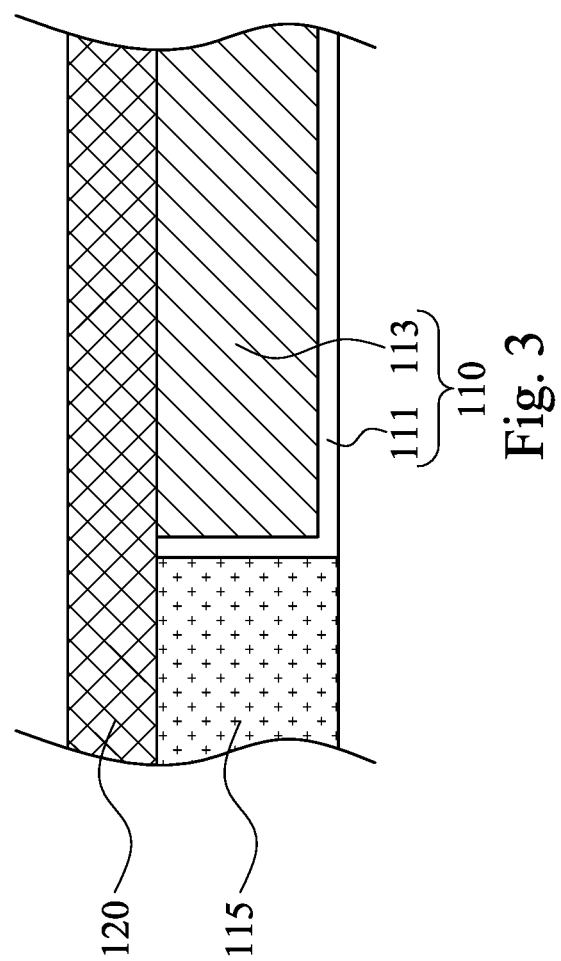
FIGS. 3 to 10 are cross-sectional views of a method for manufacturing the interconnect structure at various stages in accordance with some embodiments of the present disclosure.

Reference is made to FIGS. 3-10. FIGS. 3 to 10 are cross-sectional views of a method for manufacturing the interconnect structure 100 at various stages in accordance with some embodiments of the present disclosure. The method is a part of a back end of line (BEOL) process of integrated circuit (IC) fabrication. As shown in FIG. 3, the BEOL process includes forming a metallization layer 110 in an IMD layer 115 using a single damascene process or a dual damascene process. An exemplary IMD layer 115 shown in FIG. 3 may be formed using suitable deposition techniques, such as chemical vapor deposition (CVD), plasma enhanced chemical vapor deposition (PECVD), high density plasma chemical vapor deposition (HDP-CVD) and atmospheric pressure chemical vapor deposition (APCVD), the like, or combinations thereof. The IMD layer 115 includes a low dielectric constant (k value) material or an extremely low dielectric constant (ELK) material. Generally, a low-k dielectric material has a dielectric constant of less than about 3.5, and an ELK dielectric material has a dielectric constant of less than about 2.8. The ELK material includes, for instance, carbon-doped silicon dioxide and porous silicon dioxide.

The metallization pattern 110 is formed by using, for example, etching trenches and/or via openings in the IMD layer 115, lining the trenches and/or via openings with a diffusion barrier layer 111, filling the trenches and/or via openings with a metal fill layer 113, and performing a planarization process, such as chemical mechanical polish (CMP), to remove excess materials of the diffusion barrier layer 111 and metal fill layer 113 outside the trenches and/or via openings. Diffusion barrier layer 111 may be formed using a process such as chemical vapor deposition (CVD), physical vapor deposition (PVD), plasma enhanced CVD (PECVD), plasma enhanced physical vapor deposition (PEPVD), atomic layer deposition (ALD), combinations of these, or the like. The diffusion barrier layer 111 may include tantalum nitride, although other materials, such as tantalum, titanium, titanium nitride, combinations of these, and the like may alternatively be used. The diffusion barrier layer 111 is used to prevent copper diffusion into the dielectric. The metal fill layer 113, such as copper, may be deposited over diffusion barrier layer 111, into the trenches and/or via openings in the IMD layer 115, to form the metal vias and metal lines in the IMD layer 115. The metal fill layer 113 may be formed using suitable deposition techniques, such as CVD, PECVD, PVD, PEPVD, plating, combinations thereof, or the like.

The etch stop layer 120 is then formed over the metallization layer 110 and the IMD layer 115. The etch stop layer 120 protects the metallization layer 110 from an etching process of forming a via opening and/or a trench. In some embodiments, the etch stop layer 120 may include SiC, SiN, TEOS, hard black diamond (HBD), or the like, formed using suitable deposition techniques such as CVD, PVD, ALD, the like, or combinations thereof. For example, if silicon nitride is used as the etch stop layer 120, the silicon nitride is deposited on the top surfaces of the metallization layer 110 and the IMD layer 115 by reacting a silicon source compound and a nitrogen source. The silicon source compound provides silicon to the deposited silicon nitride and may include silane ($SiH_4$) or tetrathoxysilane (TEOS). The nitrogen source provides nitrogen to the deposited silicon nitride and may include ammonia ($NH_3$) or nitrogen gas ($N_2$). In some other embodiments, the carbon-doped silicon nitride is deposited on the top surfaces of the metallization layer 110 and the IMD layer 115 by reacting a carbon source compound, a silicon source compound, and a nitrogen source. The carbon source compound may include an organic compound, such as a hydrocarbon compound, e.g., ethylene ($C_2H_6$).

Figure 4:
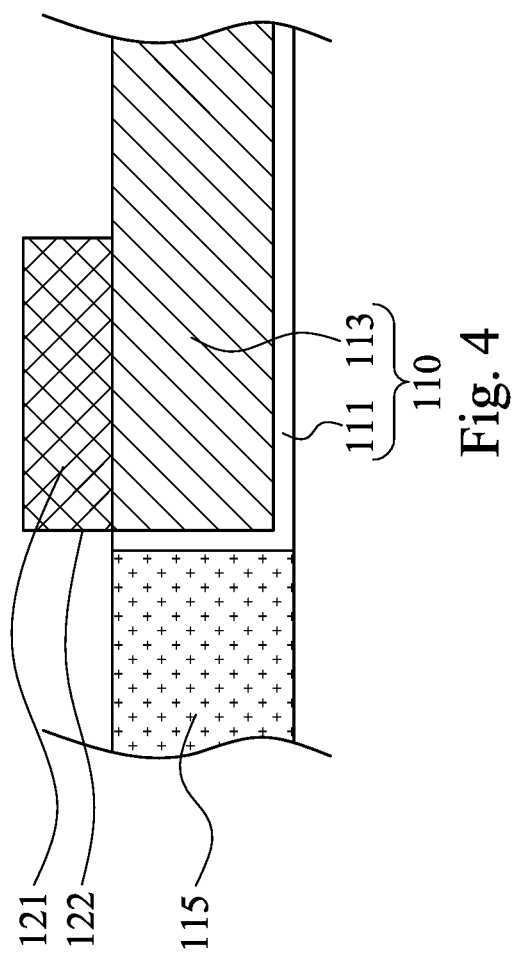
Figure 13:
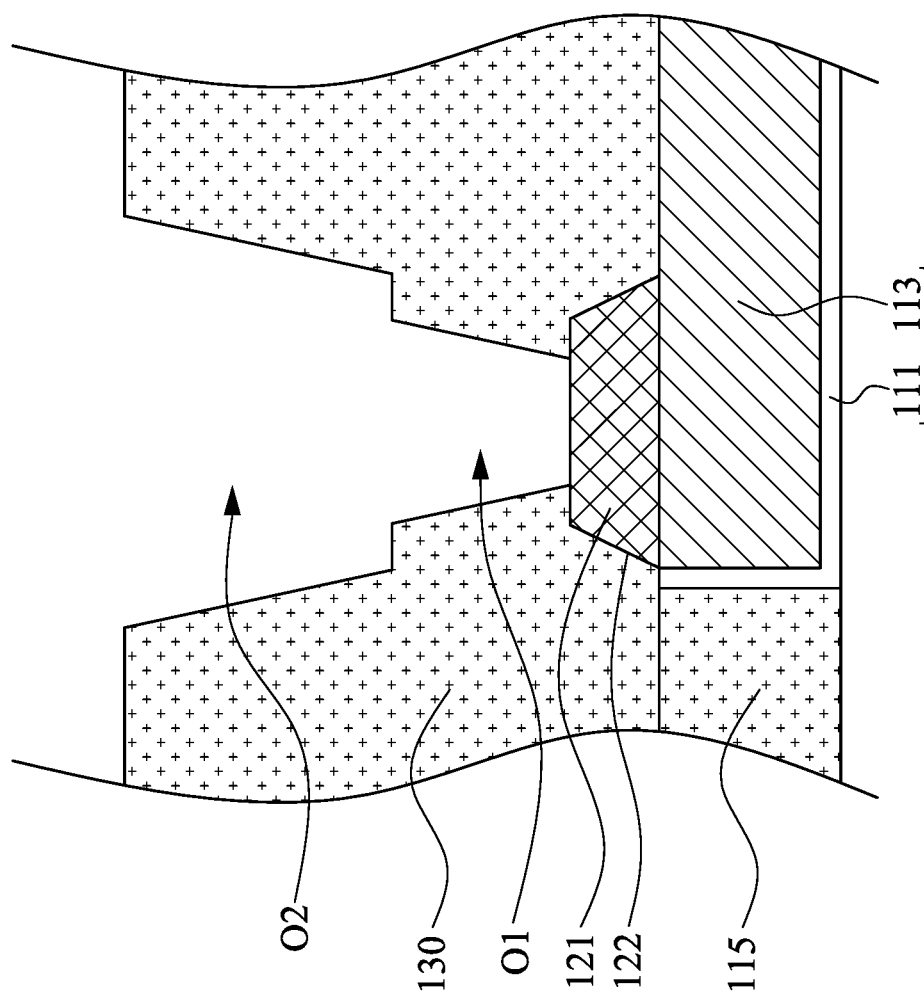

As shown in FIG. 4, the etch stop layer 120 is patterned into one or more dielectric blocks 121 on the metallization layer 110. The dielectric block 121 has an outer sidewall 122 upwardly extending from a top surface of the metallization layer 110. The dielectric block 121 can be equivalently referred to as a dielectric island formed on the metallization layer 110. Patterning the etch stop layer 120 to form the dielectric block 121 may be performed using dry etching, wet etching or combinations thereof. Due to the nature of etching, the sidewall 122 of the dielectric block 121 may be sloped with respect to the planarized top surface of the metallization layer 110, as illustrated in FIG. 13, which illustrates an exemplary sloped profile of the dielectric block 121. In the illustration of FIG. 13, the dielectric block 121 has an upwardly tapered profile, which results from the nature of etching. Therefore, the sidewall 122 of the dielectric block 121 extends at an obtuse angle from the top surface of metallization layer 110.

Formation of the dielectric block 121 as illustrated in FIGS. 3 and 4 is merely an example, and other suitable methods can be used to form the dielectric block 121. For example, after the single damascene process or dual damascene process for forming the IMD layer 115 and the metallization layer 110, a patterned photoresist with one or more openings partially exposing the metallization layer 110 can be formed over the metallization layer 110 and the IMD layer 115, a material of etch stop layer can be formed in the openings of the patterned photoresist, and then the patterned photoresist can be removed by, for example, an ash process, while leaving the material of the etch stop layer over a partial region of the metallization layer 110 to serve as the dielectric block 121.

Figure 5:
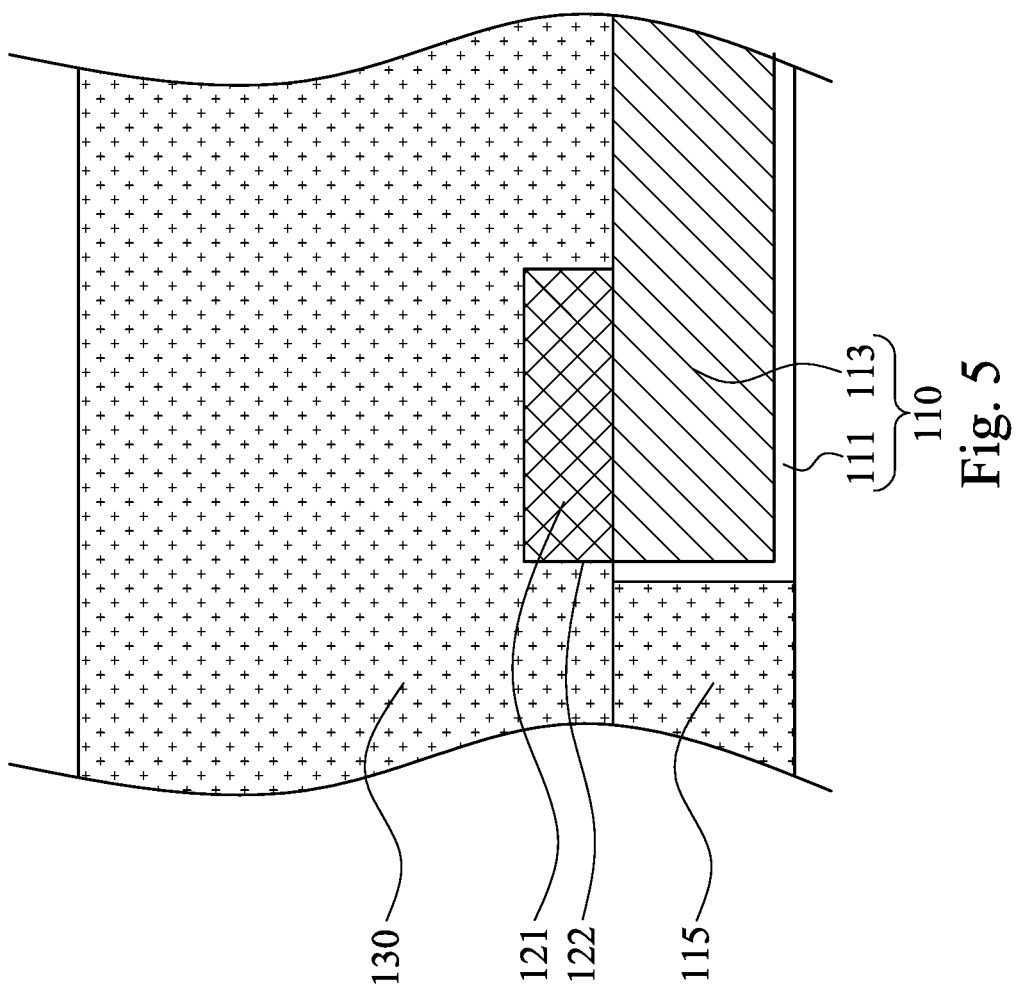

As shown in FIG. 5, a second IMD layer 130 is then formed on the dielectric block 121 and the metallization layer 110. The second IMD layer 130 is similar to or substantially the same as the first IMD layer 115 in material and/or composition, and is formed using a process similar to or substantially the same as the process of forming the first IMD layer 115, in some embodiments. For example, the second IMD layer 130 shown in FIG. 5 may be formed using suitable deposition techniques, such as chemical vapor deposition (CVD), plasma enhanced chemical vapor deposition (PECVD), high density plasma chemical vapor deposition (HDP-CVD) and atmospheric pressure chemical vapor deposition (APCVD), the like, or combinations thereof. The IMD layer 130 includes a low dielectric constant (k value) material or an extremely low dielectric constant (ELK) material. Generally, a low-k dielectric material has a dielectric constant of less than about 3.5, and an ELK dielectric material has a dielectric constant of less than about 2.8. The ELK material includes, for instance, carbon-doped silicon dioxide and porous silicon dioxide.

Figure 6:
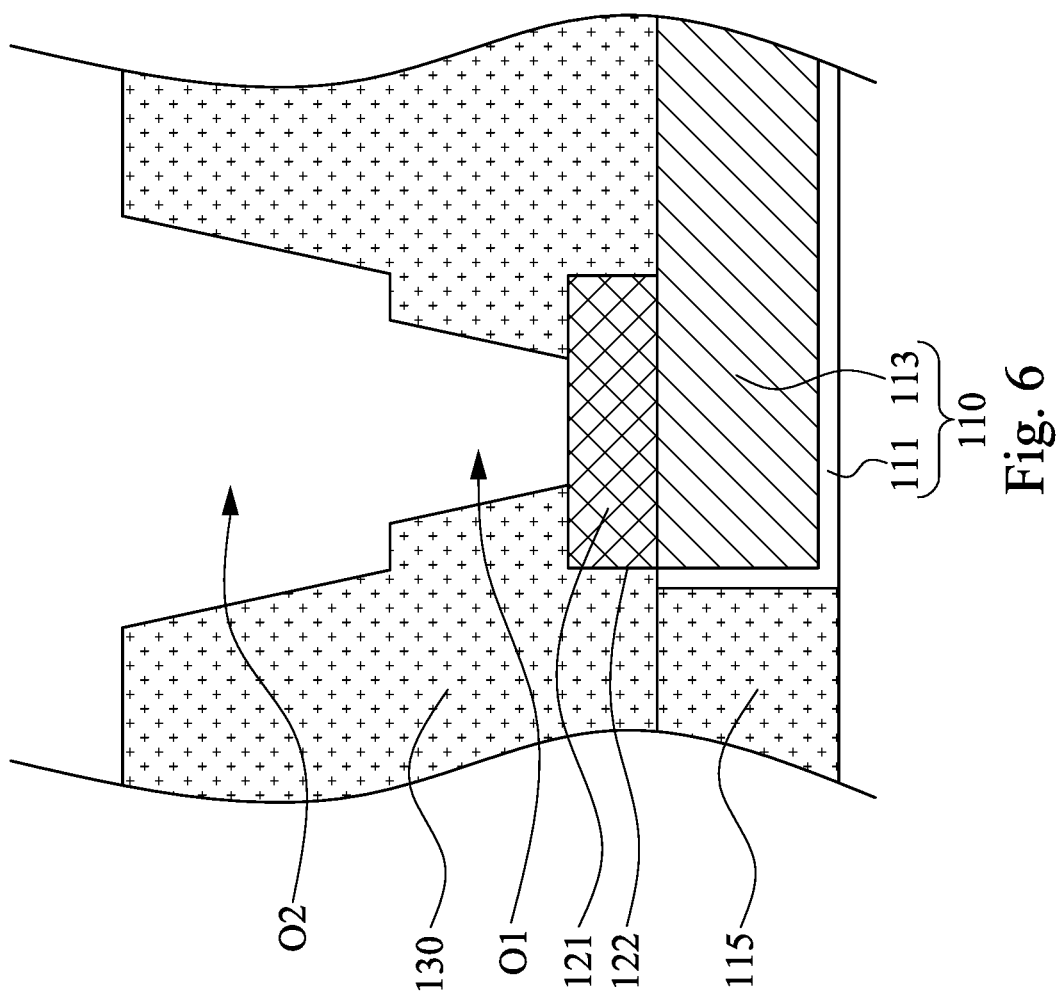

Thereafter, a dual damascene process is performed to the second IMD layer 130 to form a via opening O1 and a trench O2 over the via opening O1, as illustrated in FIG. 6. The dual damascene process includes a "via-first" patterning method in which via openings are first patterned in the second IMD layer 130 through the entire thickness of the second IMD layer 130, and then trenches are patterned in a top portion of the second IMD layer 130. Or, the trenches may alternatively be patterned in a top portion of the second IMD layer 130 first, followed by the patterning of the via openings through the second IMD layer 130, called a "trench-first" patterning method. The patterning of via openings and/or trenches in either the "via-first" method or the "trench-first" method may be performed using, for example, dry etching, wet etching or combinations thereof. Photolithography techniques may be employed to facilitate the patterning of via openings and/or trenches, in some embodiments.

As illustrated in FIG. 6. The trench O2 has a minimal width at its bottom greater than a maximal width of the via opening O1 at its top. As a result, the trench O2 and the via opening O1 collectively form a stepped sidewall profile, as illustrated in FIG. 6. The via opening O1 tapers toward the metallization layer 110 due to the nature of etching the IMD layer 130. Stated differently, a width of the via opening O1 decreases as a distance from the metallization layer 110 decreases. Similarly, the trench O2 tapers toward the via opening O1 due to the nature of etching the IMD layer 130. Stated differently, a width of the trench O2 decreases as a distance from the via opening O1 decreases.

In some embodiments, the dielectric block 121 has higher etch resistance to the etching process of forming the via opening O1 and/or the etching process of forming the trench O2 than that of the IMD layer 130. Stated differently, an etch rate of the IMD layer 130 is faster than an etch rate of the dielectric block 121 during the etching process of forming the via opening O1 and/or the etching process of forming the trench O2. This etch rate difference and/or etch resistance difference results in slowing down or even stopping the etching process of forming the via opening O1 and/or the etching process of forming the trench O2 by the dielectric block 121. Therefore, the dielectric block 121 acts as an etch stop layer in etching process of forming the via opening O1 and/or the etching process of forming the trench O2, in such a way to protect the underlying metallization layer 110 from these etching processes. As a result, the dual damascene process can selectively etch through the IMD layer 130 while keep the metallization layer 110 substantially intact.

The dielectric block 121 and the IMD layer 130 are formed of different materials so as to achieve the desired etch resistance difference and/or etch rate difference, as discussed above. A premise of selecting material(s) of the IMD layer 130 is to keep the dielectric constant of the IMD layer 130 as low as possible for reducing the RC delay, and hence the dielectric block 121, different from the IMD layer 130 in composition and/or material, is formed of a material with a higher dielectric constant than the IMD layer 130. Due to the nature of capacitive coupling, the higher the dielectric constant of the dielectric block 121 is, the more serious the RC delay is. However, the present disclosure implements the dielectric block 121 as an island-like structure that covers a partial region of the metallization layer, rather than substantial entireties of the metallization layer 110 and the IMD layer 115. Therefore, the dielectric block 121 has a reduced area compared to a blanket etch stop layer, which in turn will result in reduced capacitive coupling between neighboring metallization layers in the interconnect structure 100, which in turn will result in improved RC delay.

Figure 7:
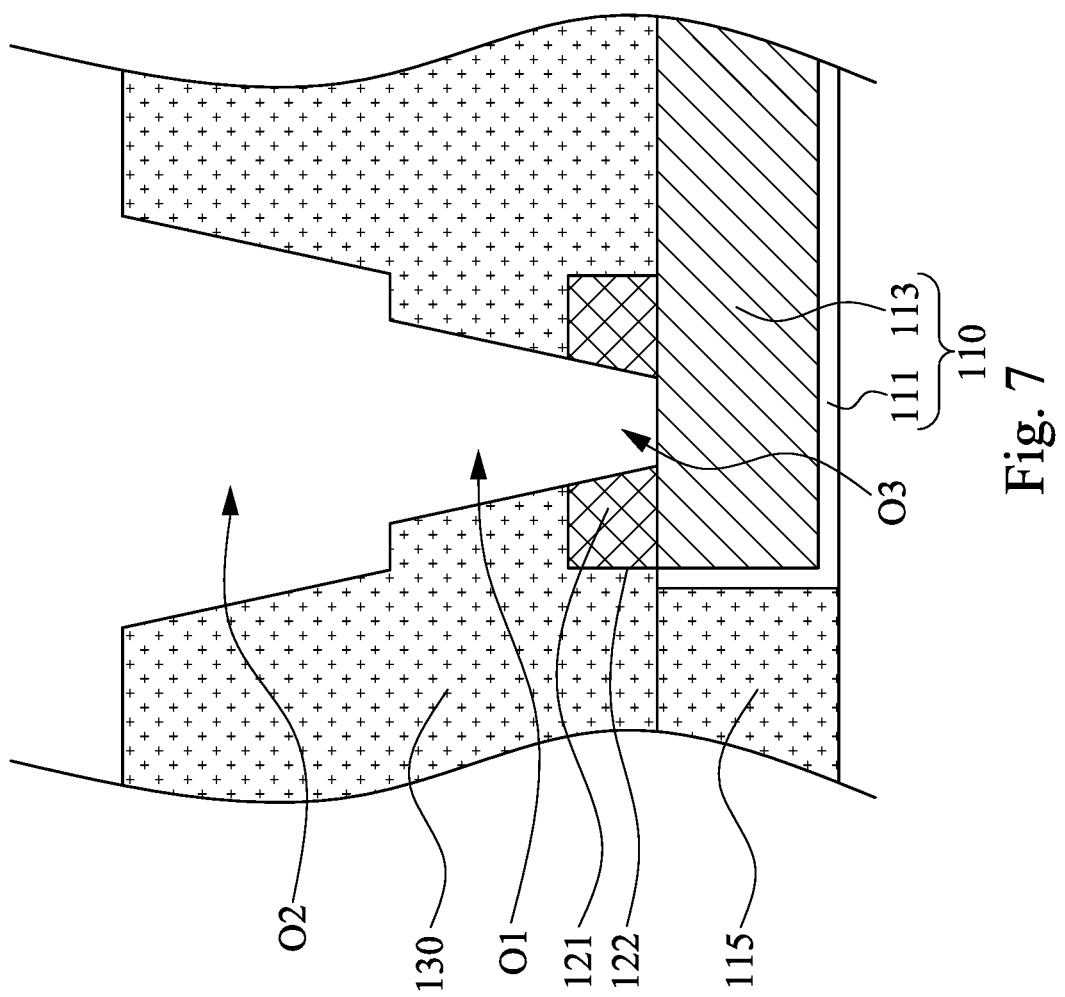

As shown in FIG. 7, a portion of the dielectric block 121 exposed by the via opening O2 is removed to form an opening O3. The opening O3 communicates with the via opening O1 and allows the metallization layer 110 to be exposed. For example, the portion of the dielectric block 121 underlying the via opening O1 can be removed by using a dry etching process. The dry etching process may have a high selectivity such that the dry etching process may stop at the metallization layer 110. For example, the dry etching process may be performed under a source power of about 150 to 220 W, and a pressure of about 10 to 45 mTorr, using $CH_2F_2$ and Ar as etching gases. Unwanted etching of the metallization layer 110 may be reduced during the etching processes of forming the opening O3 due to the high selectivity between the dielectric block 121 and the metallization layer 110. To be more specific, the metallization layer 110 may remain substantially intact after etching the opening O3 in the dielectric block 121, thereby enhancing the device performance.

Figure 8:
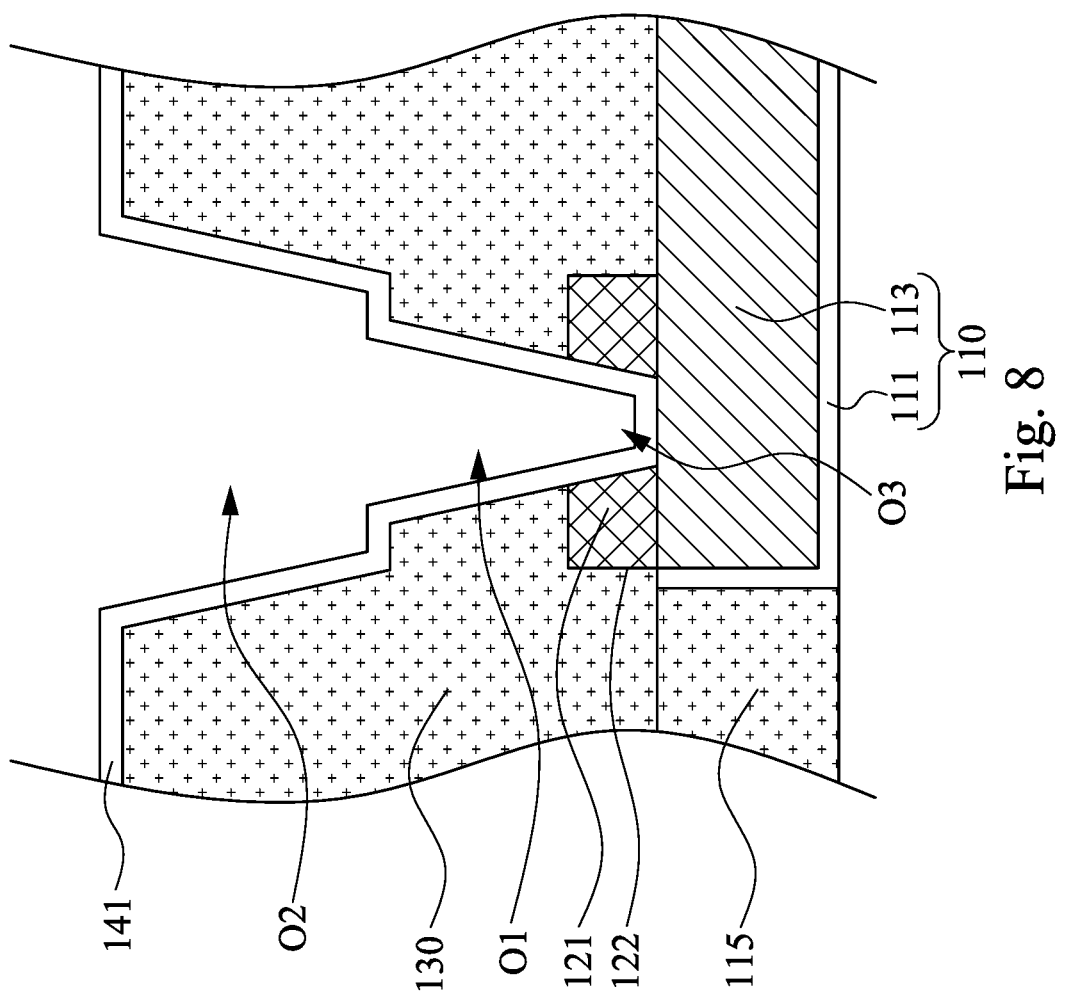

As shown in FIG. 8, a diffusion barrier layer 141 is formed on the second IMD layer 130. In particular, the diffusion barrier layer 141 is conformally formed on top surfaces of the IMD layer 130 and the metallization layer 110, sidewalls of the opening O3, the via opening O1 and the trench O2. The diffusion barrier layer 141 may be formed using a process such as chemical vapor deposition (CVD), physical vapor deposition (PVD), plasma enhanced CVD (PECVD), plasma enhanced physical vapor deposition (PEPVD), atomic layer deposition (ALD), combinations of these, or the like. The diffusion barrier layer 141 may include tantalum nitride, although other materials, such as tantalum, titanium, titanium nitride, combinations of these, and the like may alternatively be used.

Figure 9:
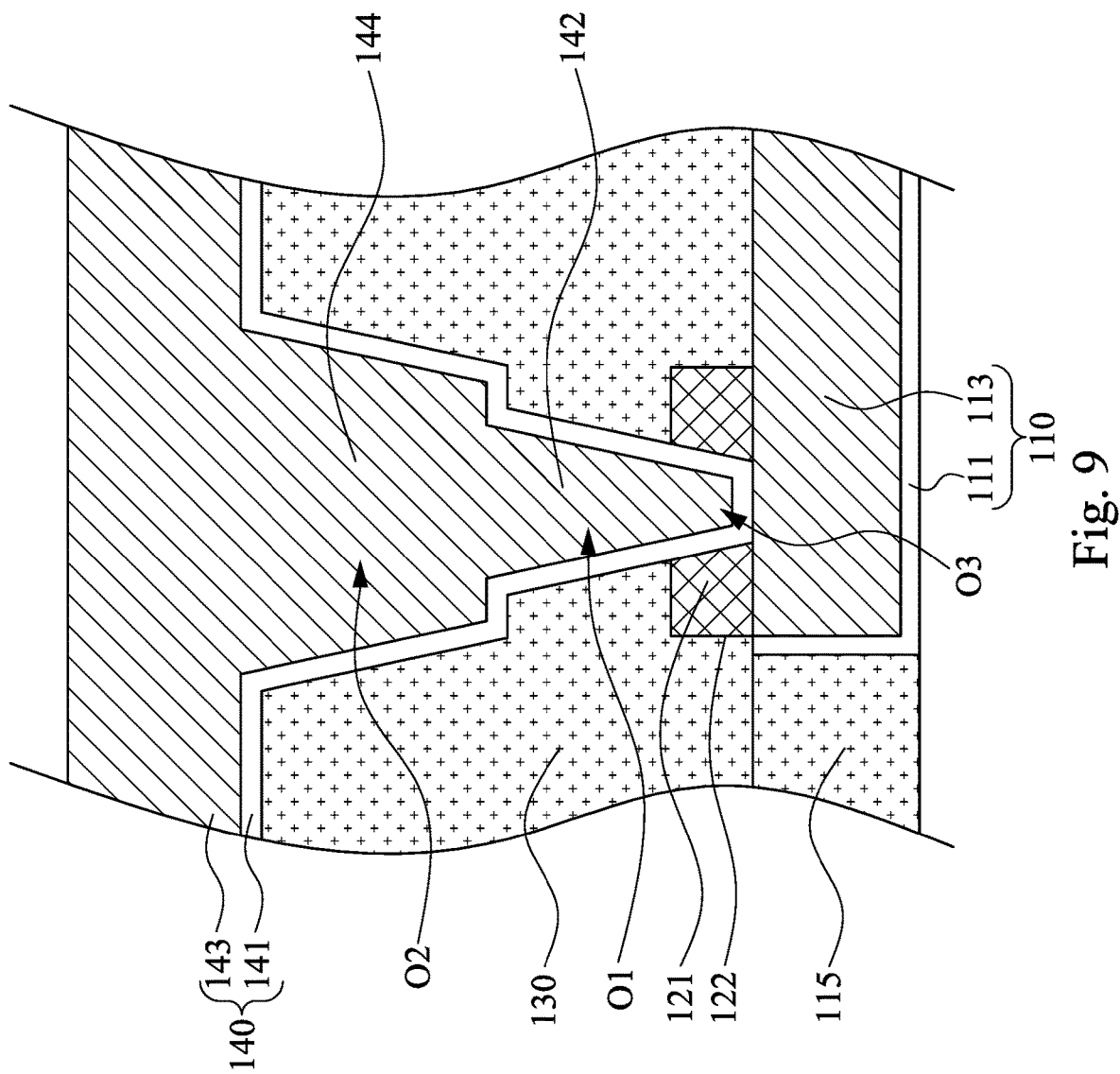
Figure 10:
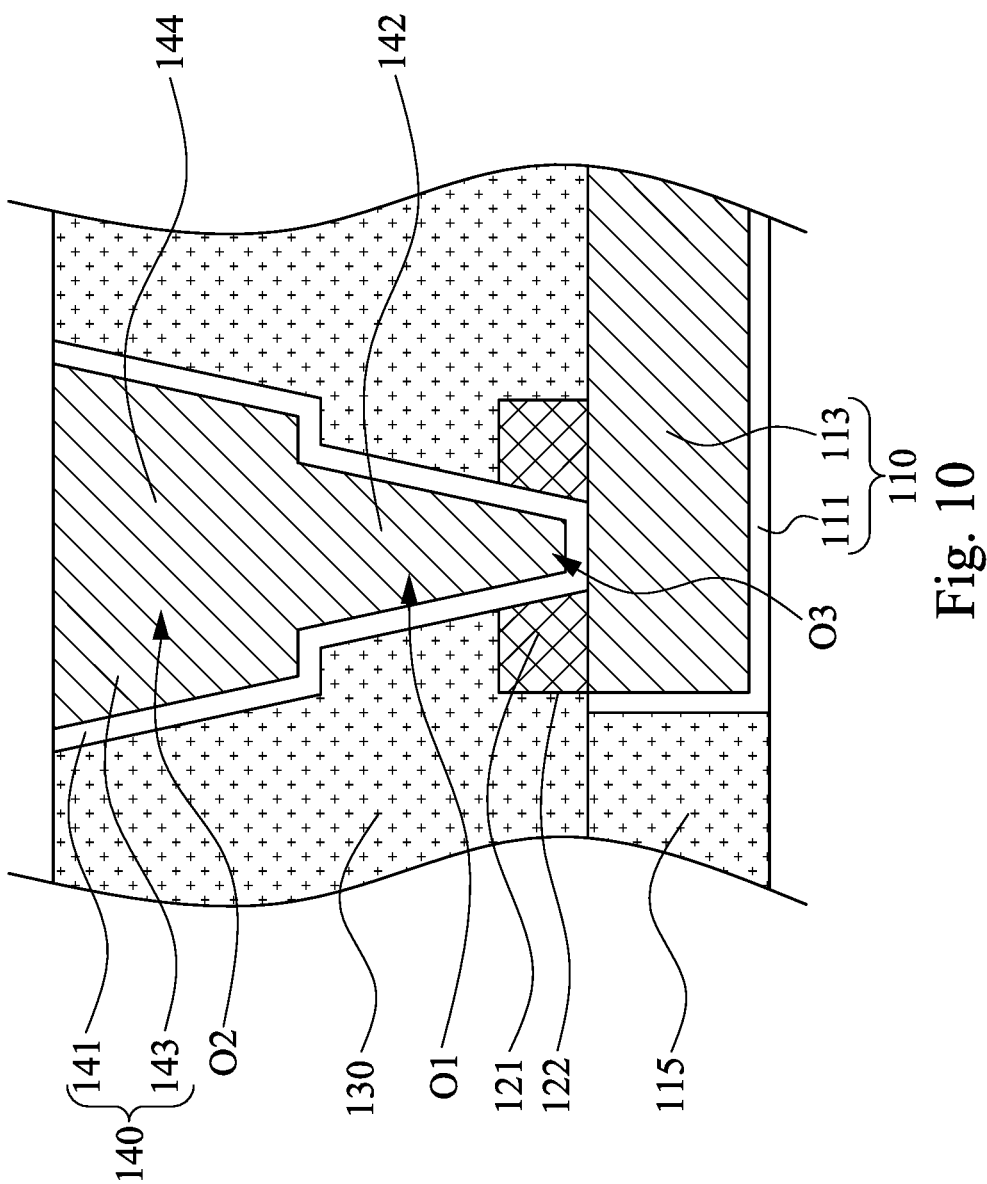

As shown in FIG. 9, the metal fill layer 143 is then formed over the diffusion barrier layer 141 and filled in the opening O3, the via opening O1 and the trench O2. Thus, the diffusion barrier layer 141 separates the metal fill layer 143 from the surrounding dielectrics, such as the IMD layer 130 and the dielectric block 121, so as to reduce unwanted diffusion from the metal fill layer 143 to the surrounding dielectrics. The metal fill layer 143 may be copper or other suitable metals, and may be formed using suitable deposition techniques, such as CVD, PECVD, PVD, PEPVD, plating, combinations thereof, or the like. Afterwards, a planarization process, such as CMP, is carried out to the metal fill layer 143 until reaching the IMD layer 130. In this way, top surfaces of the IMD layer 130, the diffusion barrier layer 141 and the metal fill layer 143 may be substantially level with each other. The remaining diffusion barrier layer 141 and metal fill layer 143 can be in combination referred to as the conductive structure 140, as discussed above. The resulting structure is illustrated in FIG. 10.

Figure 11:
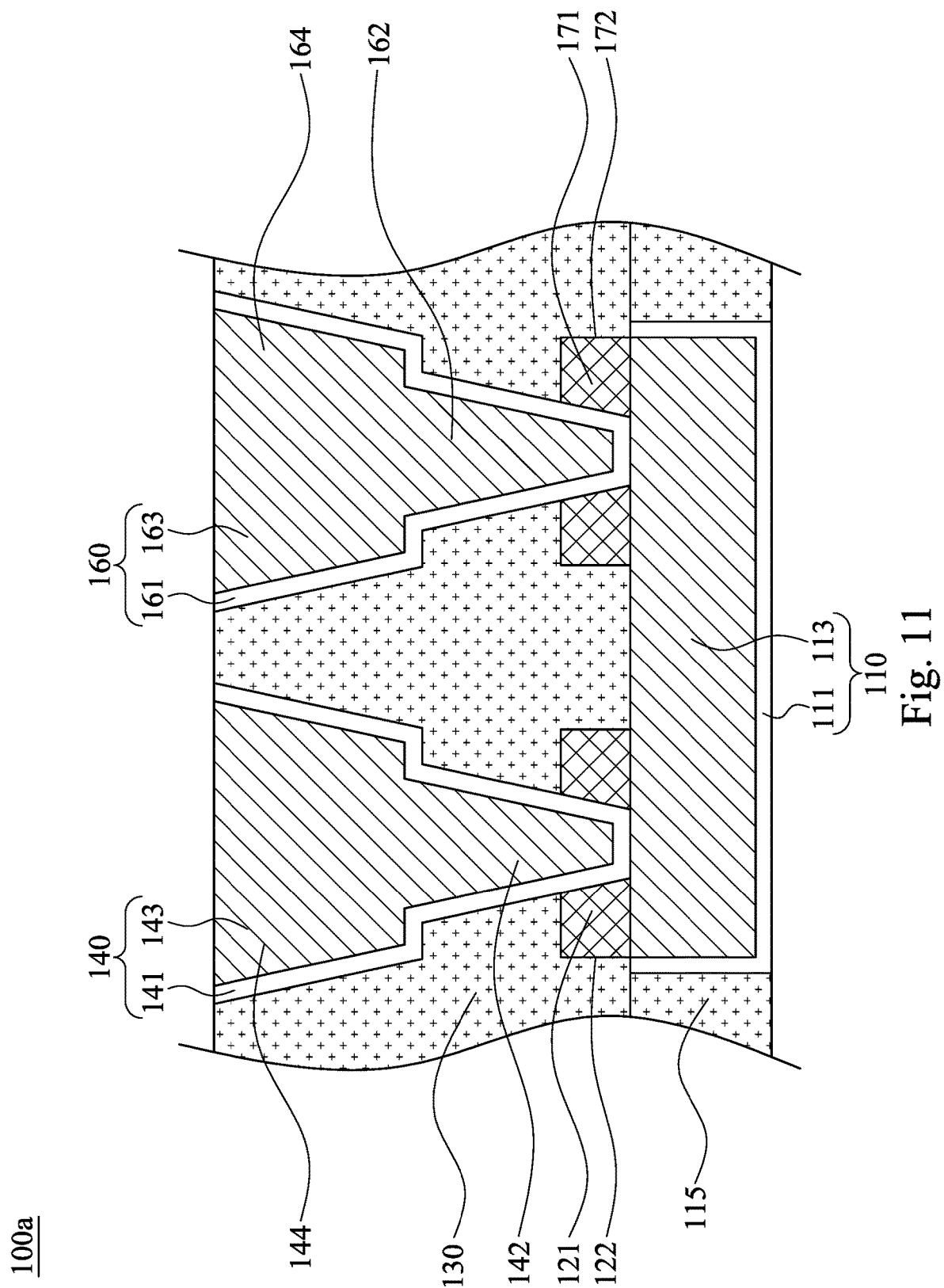
FIGS. 11-14 are cross-sectional views of interconnect structures in accordance with some other embodiments of the present disclosure.

FIG. 11 illustrates another interconnect structure 100a, which shares some of the features of the interconnect structure 100. The interconnect structure 100a includes a first IMD layer 115, a metallization layer 110 in the first IMD layer 115, a second IMD layer 130, a conductive structure 140 in the second IMD layer 130, and an island-like dielectric block 121 surrounding a metal via 142 of the conductive structure 140, as included in the interconnect structure 100 and described in detail above. Additionally, the interconnect structure 100a includes another conductive structure 160 and another dielectric block 171 in the second IMD layer 130 and over the metallization layer 110. The conductive structure 160 is similar to or the same as the conductive structure 140 as described above. For example, the conductive structure 160 includes a diffusion barrier layer 161 and a metal fill layer 163 surrounded by the diffusion barrier layer 161. The diffusion barrier layer 161 and the metal fill layer 163 are respectively similar to or the same as the diffusion barrier layer 141 and the metal fill layer 143 in composition and/or material. The diffusion barrier layer 161 and the metal fill layer 163 form a metal via 162 and a metal line 164 over the metal via 162.

The dielectric block 171 is similar to or the same as the dielectric block 121 as described above. The dielectric blocks 121 and 171 are horizontally arranged over the metallization layer 110 in a spaced apart manner. This means the dielectric blocks 121 and 171 are separated from each other, and a portion of the second IMD layer 130 is between the dielectric blocks 121 and 171. Furthermore, the second IMD layer 130 is in contact with the outer sidewall 122 the dielectric block 121 and an outer sidewall 172 of the dielectric block 171.

Figure 12:
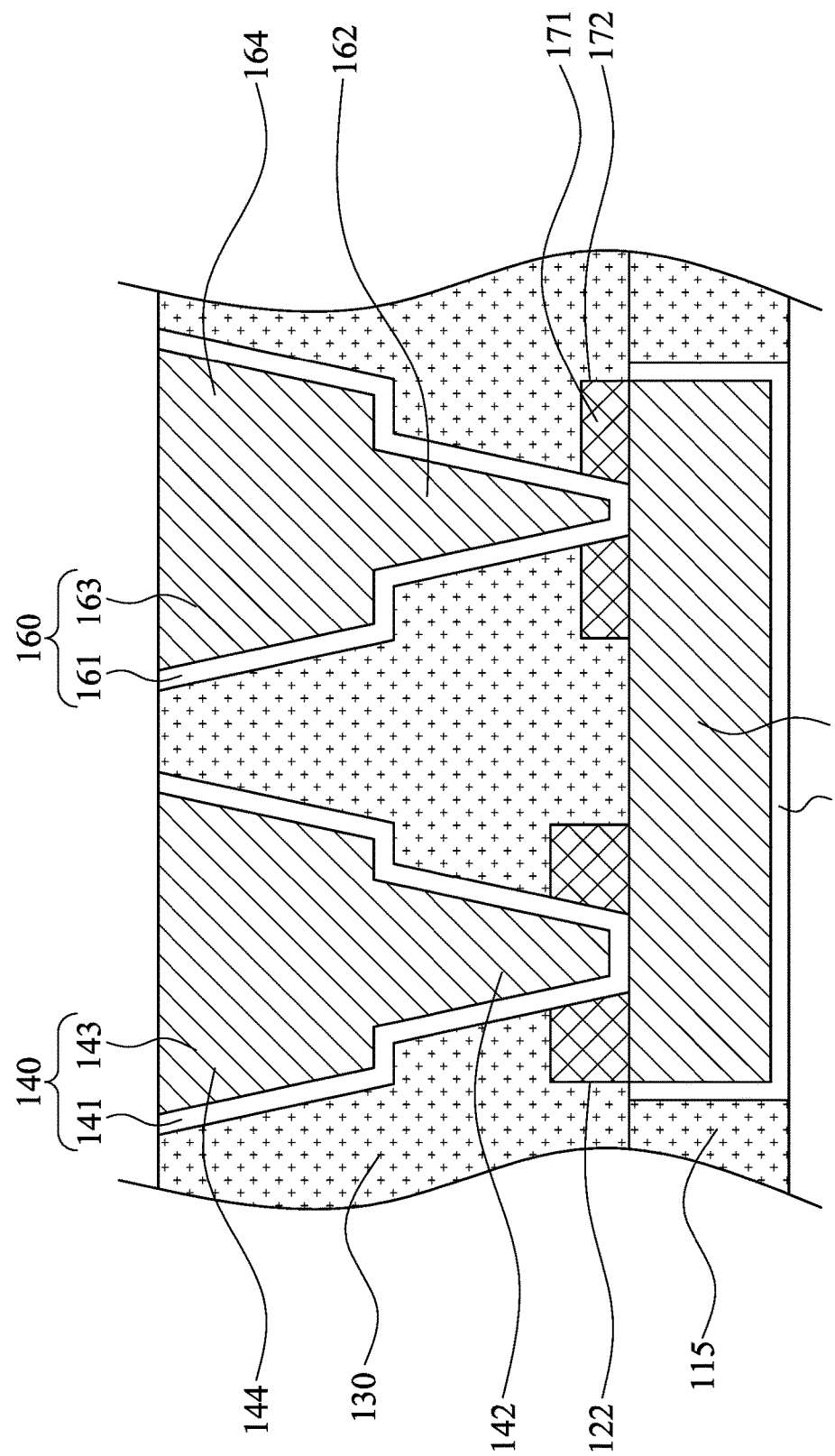

Thicknesses of the dielectric blocks 121 and 171 are proportionally related to the size of the metal vias 142 and 162. For instance, with a smaller size of the metal via 142, the dielectric block 121 can be formed thinner, and vice versa. As mentioned above, since the area of the dielectric block 121 is effectively reduced, even if the dielectric block 121 is formed thicker, the impact to the performance (e.g., RC delay) can be reduced. In some embodiments, as shown in FIG. 11, the metal vias 142 and 162 have substantially the same size. Consequently, the dielectric blocks 121 and 171 may be formed with substantially the same thickness. In some embodiments where the metal via 162 has smaller size than the metal via 142, the dielectric block 171 surrounding the metal via 162 is thinner than the dielectric block 121 surrounding the metal via 142, as illustrated in FIG. 12. The thinner the dielectric block, the lower the coupling capacitance. Therefore, the dielectric block 171 with reduced thickness will result in improved RC delay. The dielectric blocks 121 and 171 with different thicknesses can be formed using suitable lithography, deposition and/or etch techniques.

Figure 14:
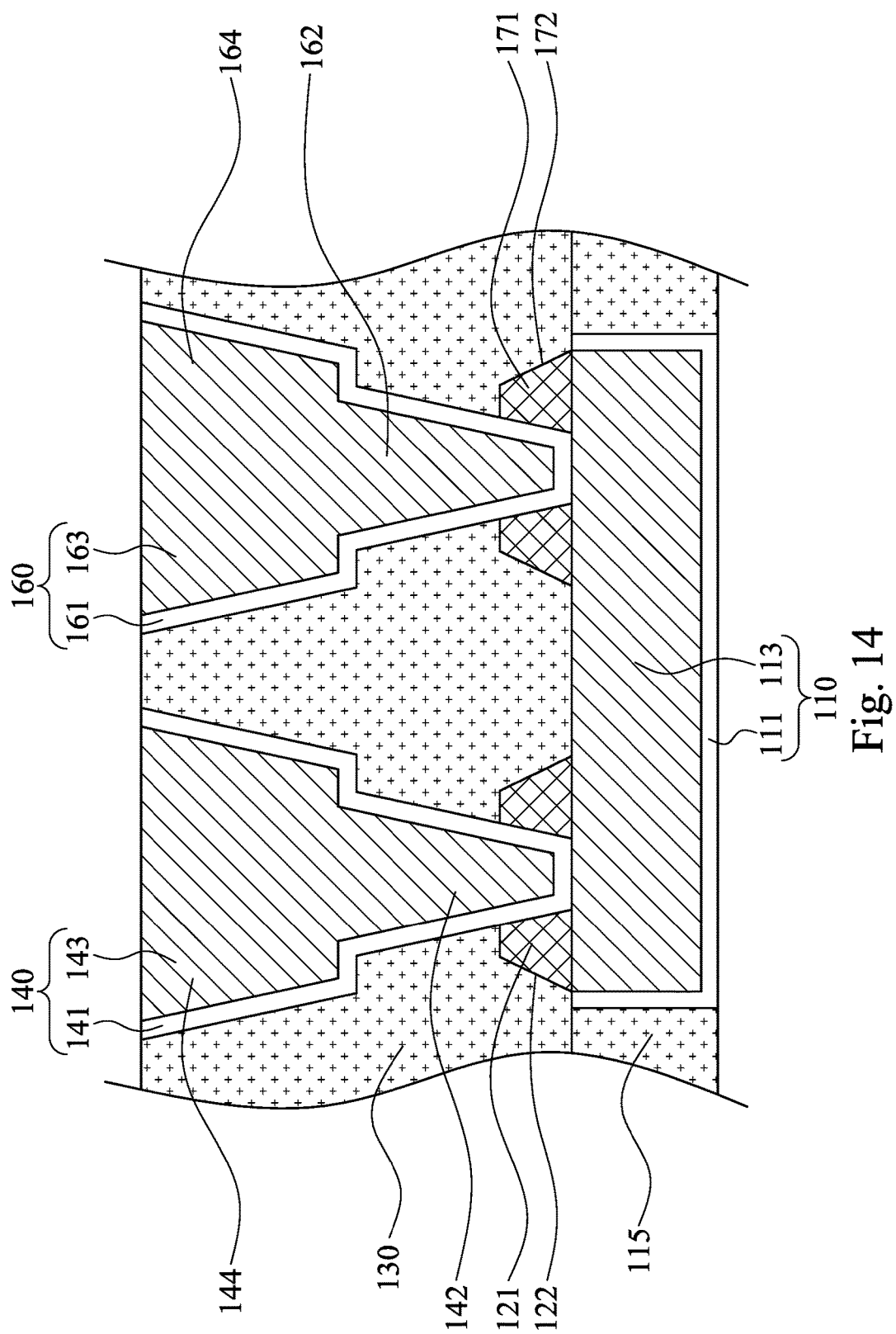

FIG. 14 illustrates another interconnect structure 100b, which shares some of the features of the interconnect structure 100a. Due to the nature of etching to form the dielectric blocks 121 and 171, the sidewalls 122 and 172 of the dielectric blocks 121 and 171 respectively may be sloped with respect to the planarized top surface of the metallization layer 110, as illustrated. In further embodiments, the dielectric blocks 121 and 171 have upwardly tapered profiles, which results from the nature of etching. Therefore, the sidewall 122 of the dielectric block 121 and the sidewall 172 of the dielectric block 171 respectively extend at obtuse angles from the top surface of metallization layer 110. Furthermore, the metal via 142 and/or metal line 144 have downwardly tapered profiles due to the nature of etching trenches and/or via openings. Therefore, the dielectric block 121 and the metal via 142 taper in opposite directions, and the dielectric block 121 and the metal line 144 also taper in opposite directions. Similarly, the dielectric block 171 and the metal via 162 taper in opposite directions, and the dielectric block 171 and the metal line 164 also taper in opposite directions.

According to some embodiments of the present disclosure, an interconnect structure includes a damascene structure, an inter-metal dielectric (IMD) layer, a dielectric block and a metal via. The inter-metal dielectric layer is over the damascene structure. The dielectric block is embedded in the IMD layer and has a different etch selectivity than the IMD layer. The metal via is in the IMD layer and through the dielectric block to electrically connect the damascene structure.

In some embodiments of the present disclosure, the damascene structure has a dielectric portion free from coverage by the dielectric block.

In some embodiments of the present disclosure, the damascene structure has a metal portion free from coverage by the dielectric block.

In some embodiments of the present disclosure, the dielectric block has an upwardly tapered profile.

In some embodiments of the present disclosure, the dielectric block and the metal via taper in opposite directions.

In some embodiments of the present disclosure, the interconnect structure further includes a metal line. The metal line is over the metal via, in which the dielectric block and the metal line taper in opposite directions.

In some embodiments of the present disclosure, the dielectric block has a higher dielectric constant than the IMD layer.

According to some embodiments of the present disclosure, an interconnect structure includes a first inter-metal dielectric (IMD) layer, a metallization layer, a first dielectric block, a second IMD layer and a first metal via. The metallization layer is in the first IMD layer. The first dielectric block is over the metallization layer. The second IMD layer surrounds the first dielectric block. The first metal via is in the second IMD layer. The first metal via penetrates through the first dielectric block and is electrically connected to the metallization layer.

In some embodiments of the present disclosure, the first dielectric block is separated from the first IMD layer.

In some embodiments of the present disclosure, a sidewall of the first dielectric block is in contact with the second IMD layer.

In some embodiments of the present disclosure, a sidewall of the first dielectric block extends from a top surface of the metallization layer.

In some embodiments of the present disclosure, the sidewall of the first dielectric block is substantially perpendicular to or sloped with respect to the top surface of the metallization layer.

In some embodiments of the present disclosure, the first dielectric block tapers away from the metallization layer.

In some embodiments of the present disclosure, the interconnect structure further includes a second metal via and a second dielectric block. The second metal via is in the second IMD layer. The second dielectric block surrounds the second metal via. The first and second dielectric blocks are arranged horizontally in a spaced apart manner.

In some embodiments of the present disclosure, a portion of the second IMD layer is between the first and second dielectric blocks.

In some embodiments of the present disclosure, the portion of the second IMD layer tapers toward the metallization layer.

In some embodiments of the present disclosure, the second IMD layer surrounds the second dielectric block.

In some embodiments of the present disclosure, a sidewall of the second dielectric block extends from a top surface of the metallization layer.

According to some embodiments of the present disclosure, a method includes forming a dielectric block over a portion of a damascene structure, while remaining another portion of the damascene structure free from coverage by the dielectric block; forming an inter-metal dielectric (IMD) layer over the dielectric block; etching a via opening in the IMD layer and over the dielectric block, wherein the dielectric block has higher etch resistance to the etching the via opening than the IMD layer; etching an opening in the dielectric block and under the via opening; and forming a metal via in the via opening and the opening.

In some embodiments of the present disclosure, forming the dielectric block includes forming an etch stop layer over an entirety of the damascene structure; and patterning the etch stop layer to form the dielectric block.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
a first inter-metal dielectric (IMD) layer;
a damascene structure embedded in the first IMD layer;
a second IMD layer over the damascene structure and in contact with the first IMD layer;
a dielectric block embedded in the second IMD layer and having a different etch selectivity than the second IMD layer, wherein a top surface of the dielectric block is in contact with the second IMD layer, the dielectric block is in contact with a first portion of a top surface of the damascene structure, the second IMD layer is in contact with a second portion of the top surface of the damascene structure, and an outer sidewall of the dielectric block in contact with the second IMD layer is inclined with respect to the top surface of the damascene structure; and
a metal via in the second IMD layer, through the dielectric block, and electrically coupled to the damascene structure.

2. The interconnect structure of claim 1, wherein the dielectric block and the metal via taper in opposite directions.

3. The interconnect structure of claim 1, further comprising:
a metal line over the metal via, wherein the dielectric block and the metal line taper in opposite directions.

4. The interconnect structure of claim 1, wherein the dielectric block has a higher dielectric constant than the second IMD layer.

5. The interconnect structure of claim 1, further comprising:
a metal line in the second IMD layer and vertically overlapping the damascene structure, wherein the top surface of the damascene structure is spaced apart from the metal line.

6. The interconnect structure of claim 1, further comprising a metal line in the second IMD layer and spaced apart from the metal via in a lateral direction, wherein the metal via is in contact with a third portion of the top surface of the damascene structure, and the metal line is over and vertically overlaps a fourth portion of the top surface of the damascene structure.

7. The interconnect structure of claim 1, wherein the damascene structure comprises a metal fill layer and a barrier layer surrounding the metal fill layer, and the outer sidewall of the dielectric block extends from an interface between the metal fill layer and the barrier layer.

8. An interconnect structure, comprising:
a first inter-metal dielectric (IMD) layer;
a metallization layer in the first IMD layer;
a first dielectric block over the metallization layer;
a second IMD layer surrounding the first dielectric block and in contact with a top surface of the first dielectric block;
a first metal via in the second IMD layer, the first metal via penetrating through the first dielectric block and electrically connected to the metallization layer;
a second metal via in the second IMD layer, wherein the first dielectric block surrounds the first metal via and is spaced apart from the second metal via, and a width of the second metal via is smaller than a width of the first metal via; and
a second dielectric block surrounding the second metal via and spaced apart from the first metal via, the first and second dielectric blocks being arranged horizontally in a spaced apart manner, wherein the second dielectric block is thinner than the first dielectric block, and the first and second dielectric blocks are over and vertically overlap the metallization layer.

9. The interconnect structure of claim 8, wherein the first dielectric block is separated from the first IMD layer.

10. The interconnect structure of claim 8, wherein a sidewall of the first dielectric block is in contact with the second IMD layer.

11. The interconnect structure of claim 8, wherein a sidewall of the first dielectric block extends from a top surface of the metallization layer.

12. The interconnect structure of claim 11, wherein the sidewall of the first dielectric block is substantially perpendicular to or sloped with respect to the top surface of the metallization layer.

13. The interconnect structure of claim 8, wherein the second IMD layer tapers toward the metallization layer.

14. The interconnect structure of claim 8, wherein the second IMD layer surrounds the second dielectric block.

15. The interconnect structure of claim 8, wherein a top surface of the metallization layer is in contact with the first dielectric block, the second IMD layer, and the second dielectric block.

16. The interconnect structure of claim 8, wherein a topmost surface of the first dielectric block is higher than a topmost surface of the second dielectric block.

17. The interconnect structure of claim 8, wherein the first dielectric block is a single piece of continuous material and has the top surface and a bottom surface opposite to the top surface, and the bottom surface of the first dielectric block is in contact with the metallization layer.

18. A method, comprising:
depositing an etch stop layer over a damascene structure;
etching the etch stop layer to form a dielectric block over a portion of the damascene structure, while a remaining another portion of the damascene structure is free from coverage by the dielectric block;
after etching the etch stop layer, forming an inter-metal dielectric (IMD) layer over the dielectric block;

after forming the dielectric block, etching a via opening in the IMD layer and over the dielectric block, wherein the dielectric block has higher etch resistance to the etching the via opening than the IMD layer;

etching an opening in the dielectric block and under the via opening to expose a portion of a top surface of the damascene structure, wherein the dielectric block tapers away from the damascene structure prior to etching the opening in the dielectric block; and forming a metal via in the via opening and the opening.

19. The method of claim 18, wherein forming the dielectric block comprises:

forming an etch stop layer over an entirety of the damascene structure; and patterning the etch stop layer to form the dielectric block.

20. The method of claim 18, wherein the dielectric block has opposite outer sidewalls extending from the top surface of the damascene structure to a top surface of the dielectric block prior to etching the via opening.

* * * * *